(12) United States Patent
McNair

(10) Patent No.: US 10,765,031 B1
(45) Date of Patent: Sep. 1, 2020

(54) MODULAR CAGE ENCLOSURE SYSTEM

(71) Applicant: Equinix, Inc., Redwood City, CA (US)

(72) Inventor: Thomas M McNair, Sunnyvale, CA (US)

(73) Assignee: Equinix, Inc., Redwood City, CA (US)

( * ) Notice: Subject to any disclaimer, the term of this patent is extended or adjusted under 35 U.S.C. 154(b) by 0 days.

(21) Appl. No.: 16/578,083

(22) Filed: Sep. 20, 2019

Related U.S. Application Data

(62) Division of application No. 15/388,769, filed on Dec. 22, 2016, now Pat. No. 10,426,056.

(51) Int. Cl.
| | | |
|---|---|---|
| *H05K 7/20* | (2006.01) | |
| *H05K 7/14* | (2006.01) | |
| *E04B 1/343* | (2006.01) | |
| *E04H 17/16* | (2006.01) | |
| *E06B 11/02* | (2006.01) | |

(52) U.S. Cl.
CPC ....... *H05K 7/1497* (2013.01); *E04B 1/34321* (2013.01); *E04B 1/34384* (2013.01); *E04H 17/163* (2013.01); *E06B 11/021* (2013.01)

(58) Field of Classification Search
CPC . E04B 1/34321; E06B 11/021; E04H 17/163; H05K 7/1497
USPC ................................................. 52/36.5, 79.12
See application file for complete search history.

(56) References Cited

U.S. PATENT DOCUMENTS

| | | | |
|---|---|---|---|
| 3,839,834 A | 10/1974 | Goddard | |
| 5,073,841 A | 12/1991 | DelGuidice et al. | |
| 6,151,852 A | 11/2000 | Linn et al. | |
| 6,373,721 B2 | 4/2002 | Lecinski et al. | |
| 7,000,784 B2 | 2/2006 | Canty et al. | |
| 7,196,910 B2 | 3/2007 | Massey | |
| 8,650,805 B1 | 2/2014 | Poleshuk et al. | |
| 9,382,711 B2 | 7/2016 | Klassy et al. | |
| 9,695,613 B2 | 7/2017 | Shepherd | |
| 10,426,056 B1 | 9/2019 | McNair | |
| 2003/0097806 A1 | 5/2003 | Brown | |
| 2008/0174217 A1 | 7/2008 | Walker | |

(Continued)

OTHER PUBLICATIONS

"Data Center Server Cages—The Strongest, Most Versatile Protection for Servers and Network Equipment," AW Systems, retrieved from http://www.awsystems.com/blog/2014/07/data-center-server-cages-the-strongest-most-versatile-protection-for-servers-and-network-equipmentl, on Jul. 11, 2016, 2 pp.

(Continued)

*Primary Examiner* — Joshua J Michener
*Assistant Examiner* — James J Buckle, Jr.
(74) *Attorney, Agent, or Firm* — Shumaker & Sieffert, P.A.

(57) ABSTRACT

In some examples, a system includes a plurality of posts and a plurality of cage panels, wherein each of the cage panels is removably coupled to one or more of the plurality of posts, wherein a nominal width of each of the cage panels is congruent based on a modulus, wherein an actual width of each of the cage panels is equal to a difference between the nominal width of the cage panel and the width of one of the plurality of posts, and wherein any combination of a subset of the plurality of cage panels coupled in a common orientation to a subset of the plurality of posts has a combined width, between respective centers of end posts of the subset of the plurality of posts, that is congruent based on the modulus.

19 Claims, 11 Drawing Sheets

(56) References Cited

U.S. PATENT DOCUMENTS

| | | | | |
|---|---|---|---|---|
| 2008/0209931 A1* | 9/2008 | Stevens | ............... | F28D 15/0275 |
| | | | | 361/699 |
| 2011/0317367 A1* | 12/2011 | Campbell | .............. | H05K 7/203 |
| | | | | 361/700 |
| 2016/0088764 A1* | 3/2016 | David | ................... | F04D 25/166 |
| | | | | 361/679.48 |
| 2018/0014434 A1 | 1/2018 | Craft, Jr. et al. | | |

OTHER PUBLICATIONS

"Eaton Cages," Eaton Corporation, retrieved from http://powerquality.eaton.com/Products-services/Enclosures/Cages.asp, on Jul. 11, 2016, 2 pp.

"Cage System Assembly," Installation Guide, Publication No. MN159005ZU, Eaton Corporation, 2013 (Applicant points out, in accordance with MPEP 609.04(a), that the year of publication, 2013, is sufficiently earlier than the effective U.S. filing date, Dec. 22, 2016, so that the particular month of publication is not in issue.) 55 pp.

"Reconfigurable Data Center Cages," Southwest Data Products, retrieved from http://www.swdp.com/pdf/data-center-cages/Data-Center-Cages-rev06-041216.pdf, on Jul. 7, 2016, 6 pp.

"Containment Panel Walls," Cool-Shield, May 14, 2016, 3 pp.

Prosecution History from U.S. Appl. No. 15/388,769, dated Nov. 20, 2017 through May 15, 2019, 61 pp.

\* cited by examiner

MODULAR CAGE ENCLOSURE SYSTEM

This application is a divisional of U.S. application Ser. No. 15/388,769, filed Dec. 22, 2016, the entire contents of which are incorporated by reference herein.

TECHNICAL FIELD

The disclosure relates to data centers, and more specifically, to customer cage enclosures within a co-location facility.

BACKGROUND

A facility such as a data center includes a data center storage space storing numerous electronic devices that produce heat, including network, server, and storage gear, as well as power distribution units for distributing power to devices within the facility. In some examples, a network services exchange provider or co-location provider (a "provider") may employ a communication facility, such as a data center or warehouse, in which multiple customers of the network services exchange provider locate network, server, and storage gear and interconnect to a variety of telecommunications and other network service provider(s). The overall data center storage space may be shared by the multiple customers.

SUMMARY

In general, the disclosure describes a modular cage enclosure system. The modular cage enclosure system is based on a specific planning grid, to provide flexibility in configuring and reconfiguring colocation space within the data center to easily accommodate changing needs for customers colocated within the data center. The modular cage enclosure system includes a plurality of posts and a plurality of cage panels removably coupled to the posts. Different cage panels may have different widths, but each of the cage panels has a nominal width that is a modular increment value, meaning that any of the nominal widths divided by the modulus has a remainder of zero. In some examples, the value of the modulus may be selected based on dimensions of infrastructure in the data center colocation space, such as a length or width of server cabinets in the colocation space, dimensions of tiles in a floor of the data center colocation space, and dimensions of support structure undergirding the floor of the data center colocation space. The modular cage enclosure system may avoid a need to manufacture custom-sized cage enclosure panels that may later be unusable for future customer needs.

In one example, a system includes a data center colocation space comprising a floor, the floor comprising a plurality of floor tiles, a plurality of posts arranged with a center of each post aligned with an adjoining edge of at least two of the plurality of floor tiles, and each post perpendicular to the floor, and a plurality of cage panels, wherein the plurality of cage panels and the plurality of posts are arranged to form at least one cage enclosure within the data center colocation space, wherein each of the cage panels is removably coupled to one or more of the plurality of posts, wherein a nominal width of each of the cage panels is congruent based on a modulus equal to a width of the floor tiles, wherein each of the cage panels has an actual width less than its nominal width.

In another example, a method includes installing, within a data center, a customer cage enclosure having first dimensions, the customer cage enclosure comprising: a plurality of posts; and a plurality of cage panels, wherein each of the cage panels is removably coupled to one or more of the plurality of posts, wherein a nominal width of each of the cage panels is congruent based on a modulus, wherein an actual width of each of the cage panels is equal to a difference between the nominal width of the cage panel and the width of one of the plurality of posts, and wherein any combination of a subset of the plurality of cage panels coupled in a common orientation to a subset of the plurality of posts has a combined width, between respective centers of end posts of the subset of the plurality of posts, that is congruent based on the modulus, wherein installing comprises arranging one or more of the plurality of cage panels and two or more of the plurality of posts to form a perimeter partition of the customer cage enclosure. The method also includes reconfiguring a portion of the perimeter partition of the customer cage enclosure to adjust a dividing partition of the customer cage enclosure perpendicular to at least a portion of the perimeter partition, by replacing at least a first cage panel of the plurality of cage panels in the perimeter partition with at least a second cage panel of the plurality of cage panels, the first cage panel having a first nominal width and the second cage panel having a second nominal width different than the first nominal width.

In a further example, a system includes a plurality of posts, each of the plurality of posts having a base plate for attaching the post to a floor of a data center colocation space, and a plurality of cage panels, wherein each of the cage panels is removably coupled to one or more of the plurality of posts, wherein a nominal width of each of the cage panels is congruent based on a modulus, wherein an actual width of each of the cage panels is equal to a difference between the nominal width of the cage panel and the width of one of the plurality of posts, and wherein any combination of a subset of the plurality of cage panels coupled in a common orientation to a subset of the plurality of posts has a combined width, between respective centers of end posts of the subset of the plurality of posts, that is congruent based on the modulus.

In a further example, a system includes a data center colocation space comprising a floor, a plurality of posts arranged with each post perpendicular to the floor, and a plurality of cage panels, wherein the plurality of cage panels and the plurality of posts are arranged to form at least one cage enclosure within the data center colocation space, the cage enclosure enclosing a plurality of cabinets, wherein each of the plurality of the posts is arranged with a center of each post aligned with an edge of at least two of the plurality of cabinets, wherein each of the cage panels is removably coupled to one or more of the plurality of posts, wherein a nominal width of each of the cage panels is congruent based on a modulus equal to a width of the cabinets, wherein each of the cage panels has an actual width less than its nominal width.

The details of one or more examples are set forth in the accompanying drawings and the description below. Other features, objects, and advantages of the disclosure will be apparent from the description and drawings, and from the claims.

BRIEF DESCRIPTION OF DRAWINGS

Like reference characters denote like elements throughout the figures and text.

DETAILED DESCRIPTION

A data center may store numerous electronic devices that produce heat, including the network, server, and storage gear, as well as power distribution units (PDUs) for distributing power to devices within the facility. The data center may be a co-location facility in which multiple customers co-locate their network equipment. Customers may require security measures to ensure that only they have access to their equipment. To ensure the proper level of security, the provider of the data center facility may provide customer cage enclosures that provide secure locations for customer equipment. The customer cage enclosures may have lockable doors with security features, such as biometric access controls, for example.

Data center storage needs of co-location facility customers may change over time. For example, an existing customer may later require a larger customer cage enclosure than initially obtained. As another example, a customer requiring a larger enclosure may leave the co-location facility, and the co-location facility provider may wish to replace the larger enclosure with multiple smaller enclosures to house multiple other customers. The disclosure describes a modular cage enclosure system based on a specific planning grid, to provide flexibility in configuring and reconfiguring colocation space within the data center to easily accommodate changing customer needs. The modular cage enclosure system may avoid a need to manufacture custom-sized cage enclosure panels that may later be unusable for future customer needs.

Figure 1:
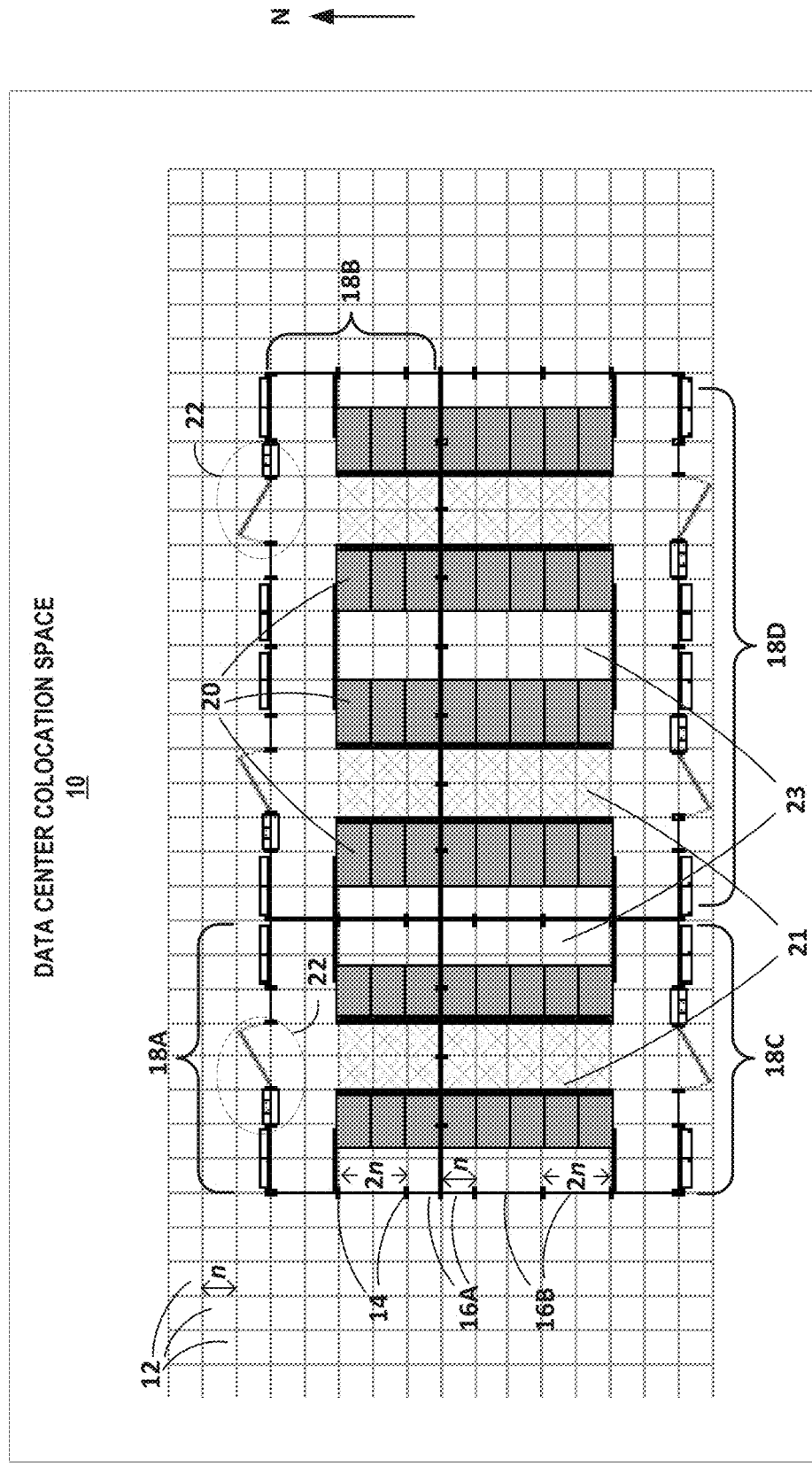
FIG. 1 is a block diagram illustrating a planview of an example data center colocation space of a data center, having a modular cage enclosure system installed in a first configuration, in accordance with one or more techniques of the disclosure.

FIG. 1 is a block diagram illustrating a plan view of an example data center colocation space 10 of a data center, having a modular cage enclosure system installed in a first configuration, in accordance with one or more techniques of the disclosure. Data center colocation space 10 may be shared by multiple customers (or "tenants") of the data center. The first configuration includes an eight-tile wide dual row arrangement, where "dual row" refers to two rows of cabinets 20.

A floor of the data center colocation space may include a plurality of floor tiles 12. In some examples, the floor may be a raised floor that provides a structural floor elevated above a solid base material. The space between the structural floor and the base material can be used for passage of mechanical or electrical services, cool air distribution, or other features. In these examples, the structural floor may include floor tiles 12, pedestal supports, and a metal framework forming a grid, upon which the floor tiles are removably positioned. In other examples, a raised floor system may not be used and the floor may be a concrete slab without floor tiles.

The modular cage enclosure system includes a plurality of posts 14 and a plurality of cage panels removably coupled to the posts 14. In some examples, posts 14 may be hollow, to receive post extensions. Posts 14 are installed such that they extend vertically outward from the floor (perpendicular to the plane of a horizontal floor). Posts 14 may be, for example, 2-inch square posts. Posts 14 may include base plates for affixing the posts 14 to a floor of the data center colocation space 10, and top mounting plates for affixing the posts 14 to a ceiling structure of the data center colocation space 10. In some examples, posts 14 may include symmetric base plates and asymmetric top mounting plates. Posts 14 may be, for example, 2 inch by 2 inch by 14 gauge square steel tubes with a 2 inch by 7 inch by ¼ inch steel flat base plate punched to accept two ⅜ inch diameter anchors.

The plurality of cage panels includes at least a first plurality of cage panels 16A having a first nominal width n, and a second plurality of cage panels 16B having a second nominal width 2n, where n is a modular value (modulus). In the example of FIG. 1, the nominal width of the cage panels 16B is double the nominal width of the cage panels 16A. In a system having at least two posts and a panel, the center line of a first post to the center line of a second post is on the modular increments. The nominal width of a cage panel may be obtained based on an actual measurement from a center of the first post, across the width of the panel, to a center of the second post.

In some examples, the modular cage enclosure system includes only two different panel widths. In other examples, the modular cage enclosure system may include more than two panel widths. That is, although shown for purposes of example in FIG. 1 as including only nominal width n and nominal width 2n, in other examples, a modular cage enclosure system may include panels having other nominal widths also based on the modular increment.

Cage panels 16A-16B ("cage panels 16") have nominal widths that are modular increments, meaning that each of the nominal widths are congruent modulo n and any of the nominal widths divided by the modulus n has a remainder of zero. In other words, the nominal widths of each of cage panels 16 is congruent based on the modulus n. In some examples, the value of the modulus may be selected based on dimensions of infrastructure in the data center colocation space, such as a length or width of server cabinets in the storage space, or the dimensions of tiles in a floor of the data center colocation space, for example. Each of cage panels 16 along the width dimension makes up part of the perimeter of at least one customer cage area. In some cases, multiple customer cages may define respective perimeters that share a cage panel, with a first face of the cage panel facing a first customer cage area and a second face of the cage panel facing a second customer cage area. Because it divides one customer cage area from another customer cage area, such a shared cage panel may be referred to as a "dividing panel." Any combination of a subset of the plurality of cage panels coupled in a common orientation to a subset of the plurality of posts has a combined width, between respective centers of end posts of the subset of the plurality of posts, that is congruent based on the modulus.

Where the modulus is n, the nominal width of cage panels 16A is n, and the nominal width of cage panels 16B is 2n. The nominal width of any panel is greater than its actual width, such that a panel having a nominal width of 2n could be replaced in the same space with one post and two panels having nominal width n. Thus, the actual width of each panel 16A, 16B is based on the nominal width of the panel minus the width of one post. That is, the actual width of a panel having nominal width n is n–p, where p is the width of a post. The actual width of cage panel 16B is 2n–p. Thus, the actual width of cage panels 16B may be replaced by one post and two of cage panels 16A, because 2n–p=p+2(n–p). Similarly, a panel having nominal width of 3n could be replaced in the same space with three panels each having nominal width of n and two posts. Alternatively, a panel having nominal width of 3n could be replaced in the same space with one post, one panel having nominal width of n, and one panel having nominal width of 2n. The term "actual width" refers to the actual physical width of the panel as measured by any typical measuring apparatus.

As one example, where the nominal widths of the cage enclosure panels are selected based on 24-inch by 24-inch floor tiles (60.96 cm), the modulus may be chosen as twenty-four inches. In some examples, the dimensions of the floor tiles may refer to nominal dimensions of the floor tiles, while in other examples, the dimensions of the floor tiles may refer to actual dimensions of the floor tiles. In this example, where posts are two inches square, cage panels 16A may have a nominal width of twenty-four inches, and an actual width of twenty-two inches. In some examples, the actual post widths may be slightly greater than 2 inches, requiring the actual dimension n to be slightly less than 22 inches to compensate, to avoid an "dimensional creep" effect in continuous runs of panels and posts. Cage panels 16B may have a nominal width of forty-eight inches (121.92 cm) and an actual width of forty-six inches (116.84 cm). In this example, the modular cage enclosure system described herein provides the ability to replace a cage panel 16B having a nominal width of forty-eight inches with a post and two cage panels 16A having nominal widths of twenty-four inches in the same space.

As another example, where the nominal widths of the cage enclosure panels are selected based on 600 mm by 600 mm floor tiles, the modulus may be chosen as 600 mm. In this example, where posts 14 are 50 mm square, cage panels 16A may have a nominal width of 600 mm, and an actual width of 550 mm. Cage panels 16B may have a nominal width of 1200 mm and an actual width of 1150 mm. Cage panels 16B may similarly be replaced with a post and two cage panels 16A in the same space.

In this manner, when the customer cage enclosures 18 are installed in a data center colocation space 10, a center of each post 14 can be aligned with an edge of one or more floor tiles 12, such as the adjoining edge of two neighboring floor tiles 12. For example, the center of a post 14 may be located at an intersection point of corners of four floor tiles 12. Selecting the cage panel dimensions for a modular cage enclosure system based on the size of floor tiles may have one or more advantages. For example, where the floor is a raised floor, using cage panels with widths that correspond to floor tile dimensions may allow the weight of cage posts and panels to be aligned with raised floor support structures. This may allow for improved distribution of weight across the data center floor, and may potentially improve overall structural integrity of the data center colocation space.

As another example, the modulus for the modular cage enclosure system may be selected as a function of dimensions of server cabinets 20. For example, the modulus n may be selected such that 2n=5w, where w is the width of a server cabinet. In this example, for server cabinets having a width of 24 inches, the modulus may be n=60 inches (5 feet (152.4 cm)). The width of the server cabinets may refer to a nominal width of the server cabinets. Panels in such a system may have nominal widths of 5 feet or 10 feet (n or 2n), and actual widths of 58 inches and 118 inches. This may allow for easy construction of cage enclosures that can accommodate at least five server cabinets, with the ability to swap out 10-foot panels with two nominal 5-foot panels and one two-inch post. This can allow for a cage enclosure having first dimensions to be divided into two cage enclosures having second (smaller) dimensions, because a dividing partition can be added to the newly added two-inch post. The dividing partition may be perpendicular to the orientation of the 5-foot panels.

Because any combination of a subset of the plurality of cage panels coupled in a common orientation to a subset of the plurality of posts has a combined width that is a modular increment of the modular value, the modular cage enclosure system described herein provides flexibility for data center administrators or customers to build any cage size having dimensions divisible by the modular increment (e.g., 24-inch increments). Further, data center colocation space 10 can easily be repurposed to fit different customer needs and accommodate multiple co-located customers, without requiring the use of customized cage enclosure components. For example, the modular cage enclosure system provides the ability to easily add or remove the dividing partitions between back-to-back cages, and to easily move the location of the existing dividing partitions between back-to-back cages, to change dimensions of the customer cage enclosures. The addition, removal, or adjustment of dividing partitions may be simplified because the modular dimensions of the panels enable adjusting as few as two of the side panels in the back-to-back customer cage enclosures while leaving the remainder of the side panels untouched.

Customer cage enclosures 18A-18D ("customer cage enclosures 18") are installed in data center colocation space 10 based on needs of data center administrators and/or customers/tenants of the data center. In some examples, each of customer cage enclosures 18 is leased by a different customer of the data center. Customer cage enclosures 18 securely contain network equipment owned or leased by the respective customers. Each of customer cage enclosures 18 may include a door assembly 22. Door assemblies 22 may include a door and an adjacent door panel configured to include a biometric security device and an in-mesh demarcation panel, for example. Door assemblies 22 may have a width of 3n, in some examples. In this way, a door assembly 22 could be replaced with a 2n-width panel, a post, and an n-width panel. In some examples, both the strike and hinge posts 14 in door assembly 22 may include openings to accommodate the strike box and wiring for the biometric reader and electrified hinge. One example of such a post is described in further detail with respect to FIG. 10.

In the example of FIG. 1, customer cages 18 are installed in an arrangement corresponding to an eight-tile wide dual row of server cabinets 20. In this example, customer cage enclosure 18A is installed with a first side having a width of four cage panels, each of the cage panels having a nominal 2n width, to span a combined width aligned with eight floor tiles. A second side of customer cage enclosure 18A, opposite the first side, has two cage panels of nominal 2n width, one cage panel of nominal 1n width, and a 3n wide door assembly 22 consisting of a door, post and a biometric reader/demarcation panel section. Customer cage enclosure 18A has a third side having a combined width made up of two cage panels of nominal 2n width and one cage panel of nominal 1n width, to span a combined width aligned with five floor tiles. Customer cage enclosure 18A has a fourth side, opposite the third side, having the same configuration as the third side.

Customer cage enclosures 18 house a plurality of cabinets 20. In some examples, cabinets 20 may be 600 mm wide (twenty-four inch nominal width). Cabinets 20 may have depths between 1000 mm (40 inch nominal depth) and 1200 mm (48 inch nominal depth). Cabinets having other widths and/or depths may also be used. Cabinets 20 (sometimes also called "racks") may be server cabinets, network cabinets, or other cabinets, and typically include frames for mounting one or more types of equipment, such as servers, switches, routers, patch panels, uninterruptible power supplies (UPSs), monitors, and other equipment.

Data center colocation space 10 is part of an overall data center. Data center colocation space 10 may store network and/or storage gear or any other suitable electronic or supporting devices. The data center may additionally include one or more cooling units that cool and supply air to data center colocation space 10. When in use, server exhaust is released from servers in cabinets 20. Warm air, including server exhaust is returned as return air to be cooled and recirculated by the cooling unit. The data center may be situated in a stand-alone building used primarily or exclusively for the data center, or may be situated in a portion of a larger building used for other uses including office space, residential space, retail space, or any other suitable use. The data center may be in an urban, suburban, or rural location or any other suitable location with any suitable climate. The data center may provide an operating environment for co-location, interconnection, and/or other services. For example, the data center may provide an operating environment for any number of services that may be categorized according to service types, which may include, for example, applications/software, platforms, infrastructure, virtualization, and servers and data storage. The names of service types are often prepended to the phrase "as-a-Service" such that the delivery of applications/software and infrastructure, as examples, may be referred to as Software-as-a-Service (SaaS) and Infrastructure-as-a-Service (IaaS), respectively.

Servers housed by cabinets 20 may be systems that respond to requests across a computer network to provide, or help to provide, a network or data service. Each of the servers may include one or more processors that execute software that is capable of accepting requests from clients. Requests from clients may be to share data, information, or hardware and software resources. The servers may include one or more of a database server, file server, storage server, mail server, print server, web server, gaming server, application server, communication server, compute server, media server, or any other suitable type of server that may be employed by a data center provider or tenant of the data center provider, according to particular needs. The servers may be specialized or general-purpose devices. The servers may represent x86 or other real or general-purpose servers configured to apply and/or offer services to customers. The servers may also include special-purpose appliances or controllers for providing interconnection services between customers of a co-location facility provided by the data center or for providing any other suitable services according to particular needs.

Customer cage enclosure 18A encloses six cabinets 20 arranged in two rows of three cabinets 20. Customer cage enclosure 18B encloses twelve cabinets 20 arranged in four rows of three cabinets 20. Customer cage enclosure 18C encloses ten cabinets 20 arranged in two rows of five cabinets 20. Customer cage enclosure 18D encloses twenty cabinets 20 arranged in four rows of five cabinets 20.

In some examples, the data center may employ a cooling air supply system delivering the cooling air as a horizontal stream, or a vertical downflow from a ceiling or a higher level, or as vertical upflow from a raised floor, for cooling electronic devices within the data center. Servers and other equipment may pull cool air from streams of cool air in relatively cooler "cold aisles" 21 as needed and discharge warm server exhaust into contained "hot aisles" 23 that are relatively hotter. Hot aisles 23 are formed by hot air containment units that separate the hot and cold aisles 21 and include air containment doors. The air containment doors provide access to hot aisles 23. In some examples, the ceiling structure may be a dropped ceiling structure that forms a plenum between the dropped ceiling and an actual ceiling of the data center colocation space. The plenum may collect hot air from the hot aisles 23, for example. The warm server exhaust may be returned to a cooling unit as return air for cooling and recirculation in cool air streams in the cold aisles 21. Alternatively or in addition, cool outdoor air may be supplied as a portion of the cool air streams supplied by the cooling unit to the cold aisles. In the example of FIG. 1, cool air may be returned to cold aisles 21 by perforated floor tiles between the rows of cabinets 20.

Figure 2:
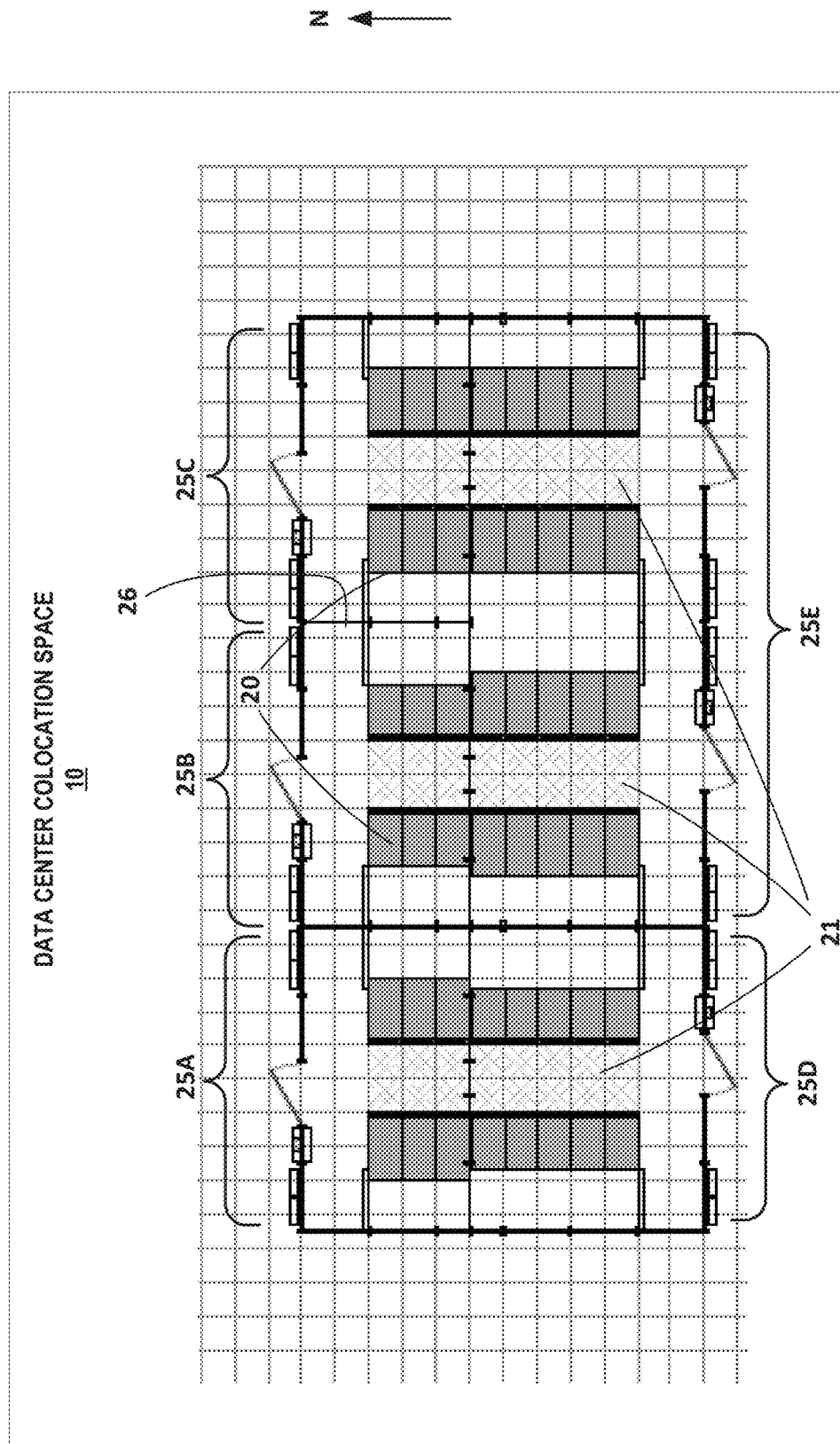
FIG. 2 is a block diagram illustrating a plan view of an example data center having a modular cage enclosure system installed in a second configuration, in accordance with one or more techniques of the disclosure.

FIG. 2 is a block diagram illustrating a plan view of an example data center colocation space 10 having a modular cage enclosure system installed in a second configuration, in accordance with one or more techniques of the disclosure. The second configuration is a nine-tile wide dual row arrangement. Customer cage enclosures 25A, 25B, and 25C each enclose six cabinets arranged in two rows of three cabinets. The nine-tile wide arrangement may allow for a larger cabinet size than in an eight-tile wide arrangement. Customer cage enclosure 25D encloses ten cabinets arranged in two rows of five cabinets. Customer cage enclosure 25E encloses twenty cabinets arranged in four rows of five cabinets. The example of FIG. 2 illustrates a cage enclosure layout in which the perimeter partitions that extend in one direction (here, north-to-south) are offset from the edges of the perforated floor tiles, to allow the rows of perforated floor tiles in the cold aisles 21 to remain unobstructed by the cabinets 20.

In FIG. 2, for example, the modular cage enclosure system of FIG. 1 may have been modified (e.g., partially uninstalled and reinstalled) to convert from an eight-tile wide dual row of FIG. 1 to the nine-tile wide dual row configuration of FIG. 2. For example, customer cage enclosure 18A of FIG. 1 may be modified to form customer cage enclosure 25A of FIG. 2 by replacing a nominal 24-inch panel next to the door assembly with a nominal 48-inch door panel, and adding a new nominal 24-inch panel to a south perimeter partition of customer cage enclosure 18A to increase the width of the south perimeter partition by from eight floor tiles to nine floor tiles.

As another example, the single customer cage enclosure 18B of FIG. 1 may be modified to form two customer cage enclosures 25B and 25C of FIG. 2 in a similar manner, by replacing each of the nominal 24-inch panel next to the door assemblies with nominal 48-inch panels, and adding two new nominal 24-inch panels to the south perimeter partition of customer cage enclosure 18B to increase the width of the south perimeter partition by from sixteen floor tiles to eighteen floor tiles. In addition, a new partition 26 made up of multiple panels removably attached to new or existing posts of customer cage enclosure 18B may be added to divide customer cage enclosure 18B of FIG. 1 into the two customer cage enclosures 25B and 25C of FIG. 2. In some examples, customer cage enclosures 25B and 25C of FIG. 2 may be used to house equipment of two different customers of the data center.

The modular cage system described herein may be particularly useful during a cage design phase, because its modular nature allows for straightforward modification using the basic planning grid of the modularity. In some cases, it may not be practical to change the overall width of customer cage enclosures after installation, other than by removing dividing partitions, because the overall perimeter of the cage space is typically fixed by corridors and walls within the colocation facility, so any width increase in one case results in a decrease in an adjoining cage (which may be currently occupied by another customer and thus not changeable). There may also be fixed items such as structural columns, remote power panels, lighting, ducts, perforated floor tiles, and cable tray and air containment systems, for example, which may interfere with making certain changes to customer cage perimeter wall dimensions.

Figure 3:
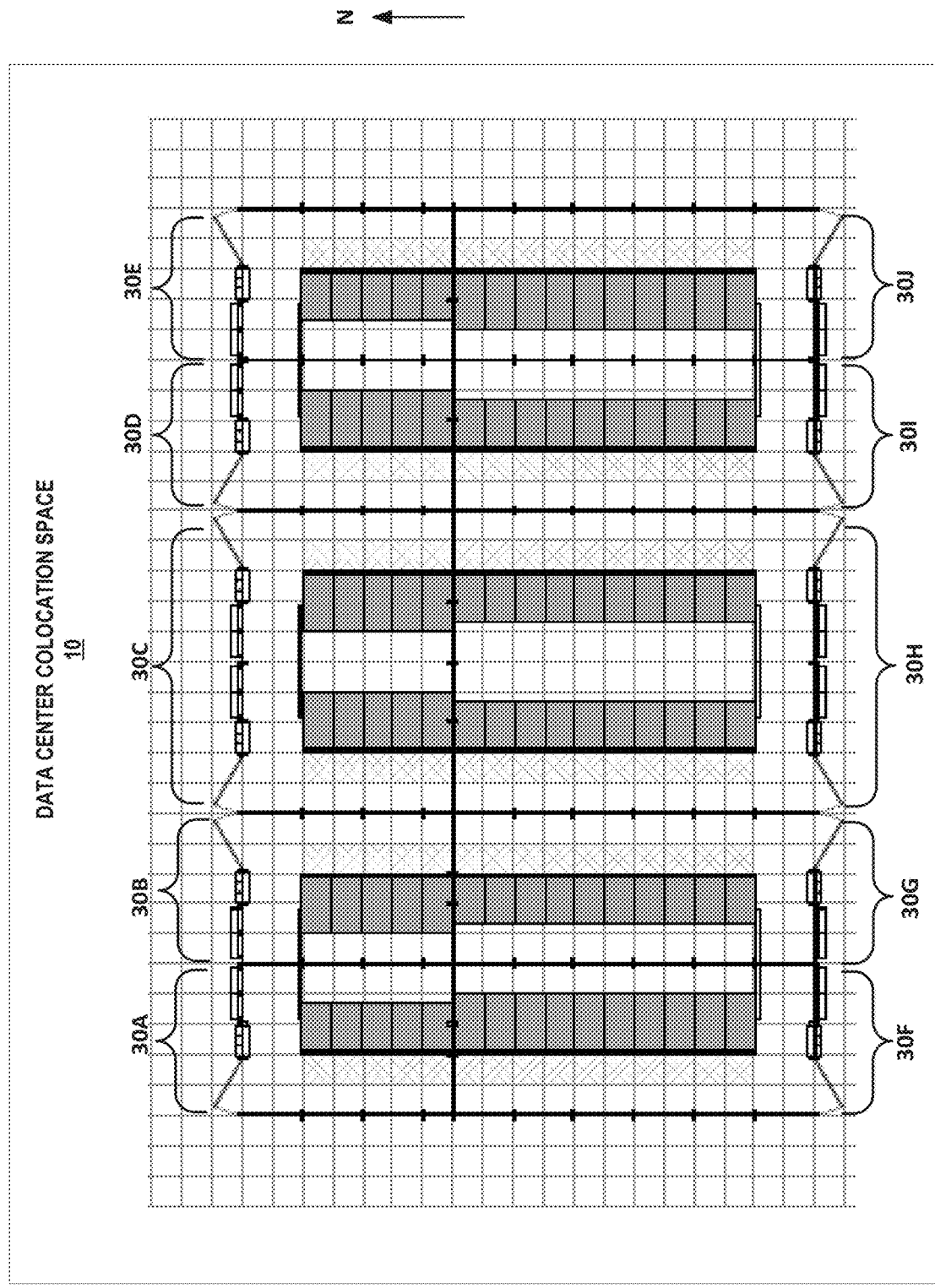
FIG. 3 is a block diagram illustrating a plan view of an example data center having a modular cage enclosure system in a third configuration, in accordance with one or more techniques of the disclosure.

FIG. 3 is a block diagram illustrating a plan view of an example data center colocation space 10 having a modular cage enclosure system in a third configuration, in accordance with one or more techniques of the disclosure. The third configuration includes cage enclosures in a ten-tile wide dual row arrangement (e.g., customer cage enclosures 30C and 30H), and cage enclosures in a five-tile wide single row arrangement (e.g., customer cage enclosures 30A, 30B, 30D, 30E, 30F, 30G, 30I, and 30J).

For example, the modular cage enclosure system of FIG. 1 may have been modified (e.g., partially uninstalled and reinstalled) to convert from an eight-tile wide dual row of FIG. 1 or the nine-tile wide dual row of FIG. 2 to the the-tile wide dual row and five-tile wide single row configuration of FIG. 2. The configuration of FIG. 3 uses the same modular cage enclosure system basic building blocks of posts, nominal 1n panels, and nominal 2n panels. The modular cage enclosure system provides a flexible, adaptable system for customer cage enclosures that can be modified to meet changing customer needs.

Figure 4:
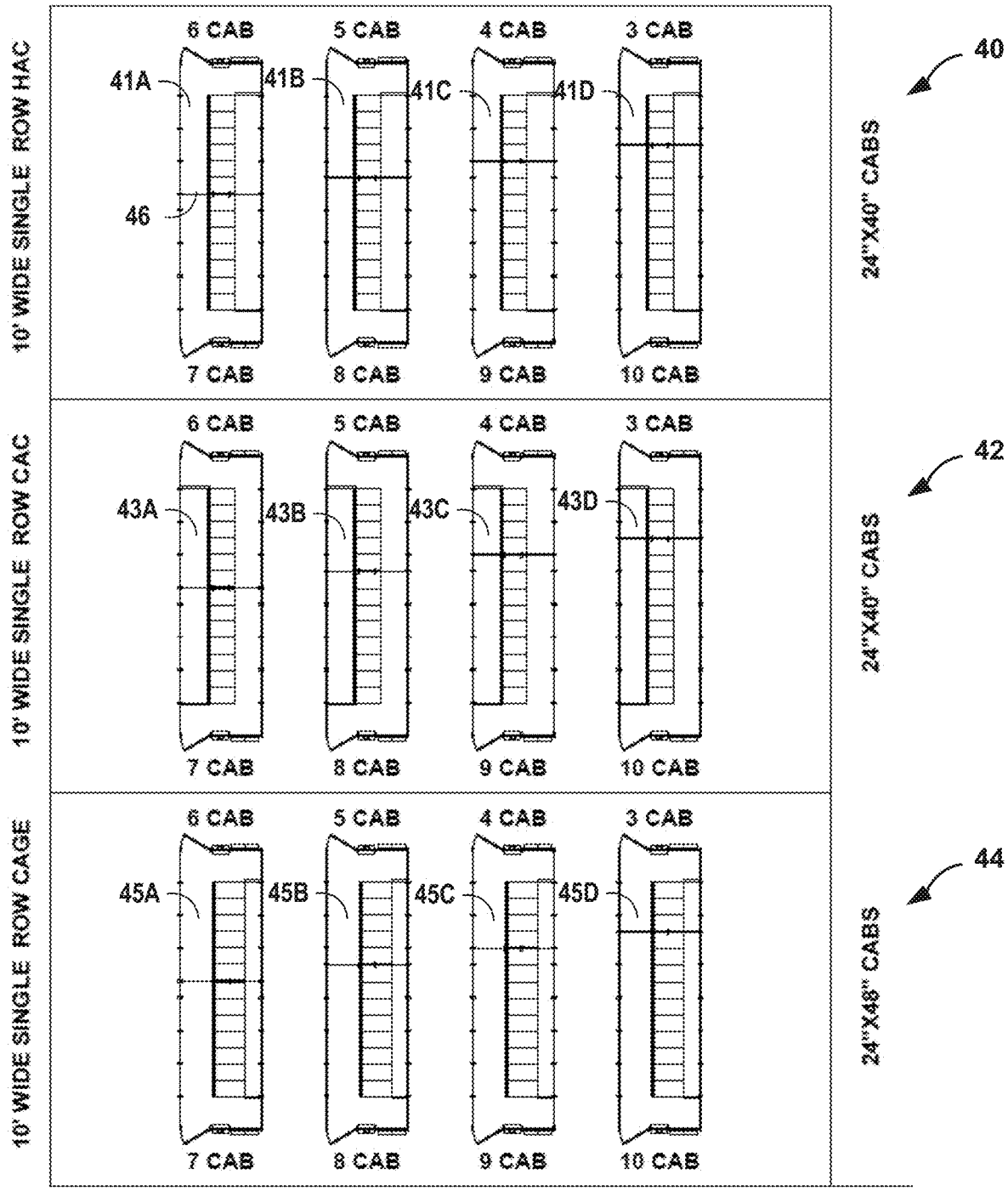
FIGS. 4-6 are block diagrams illustrating example configurations of a module cage enclosure system, in accordance with one or more techniques of the disclosure.
Figure 5:
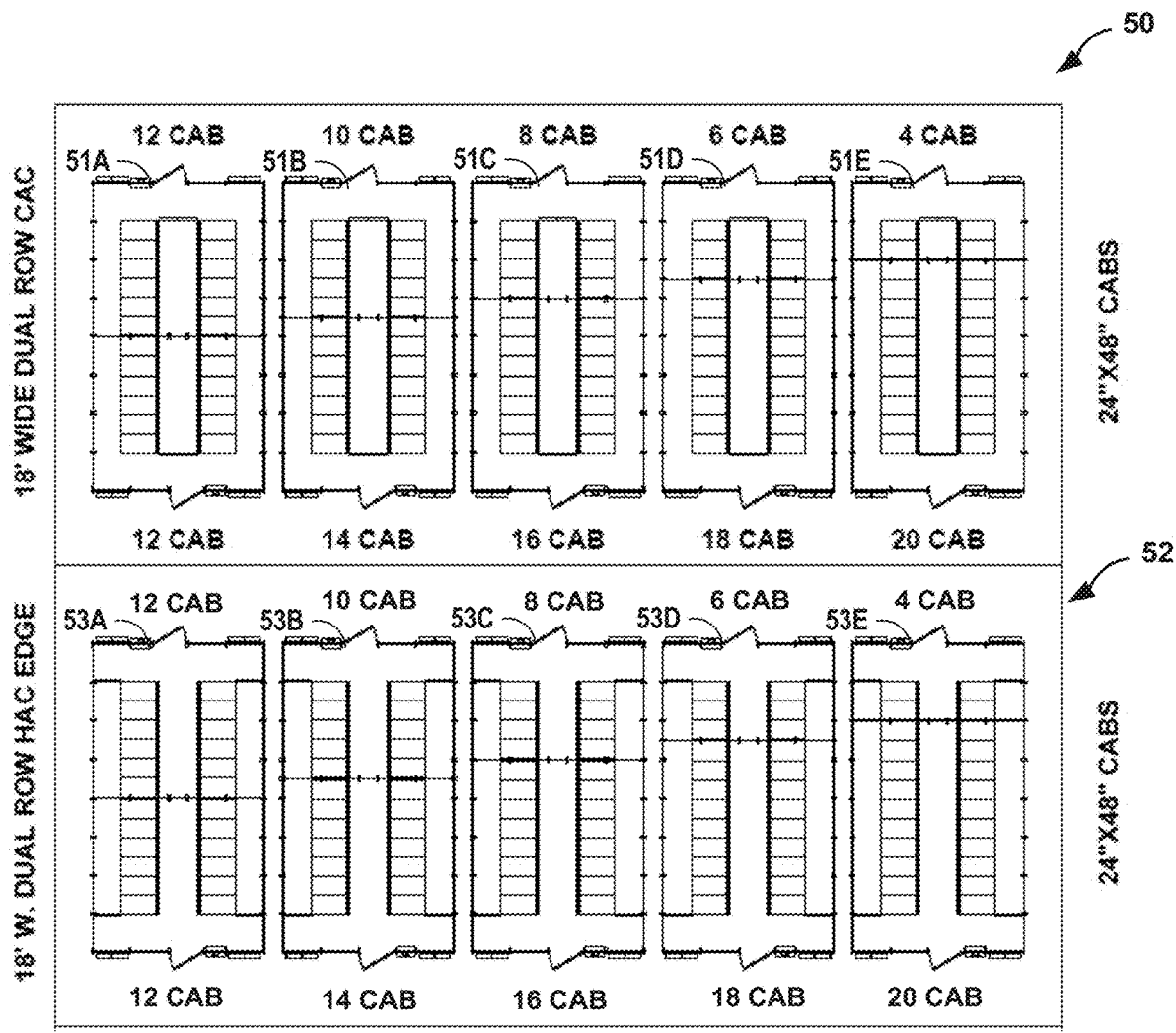
Figure 6:
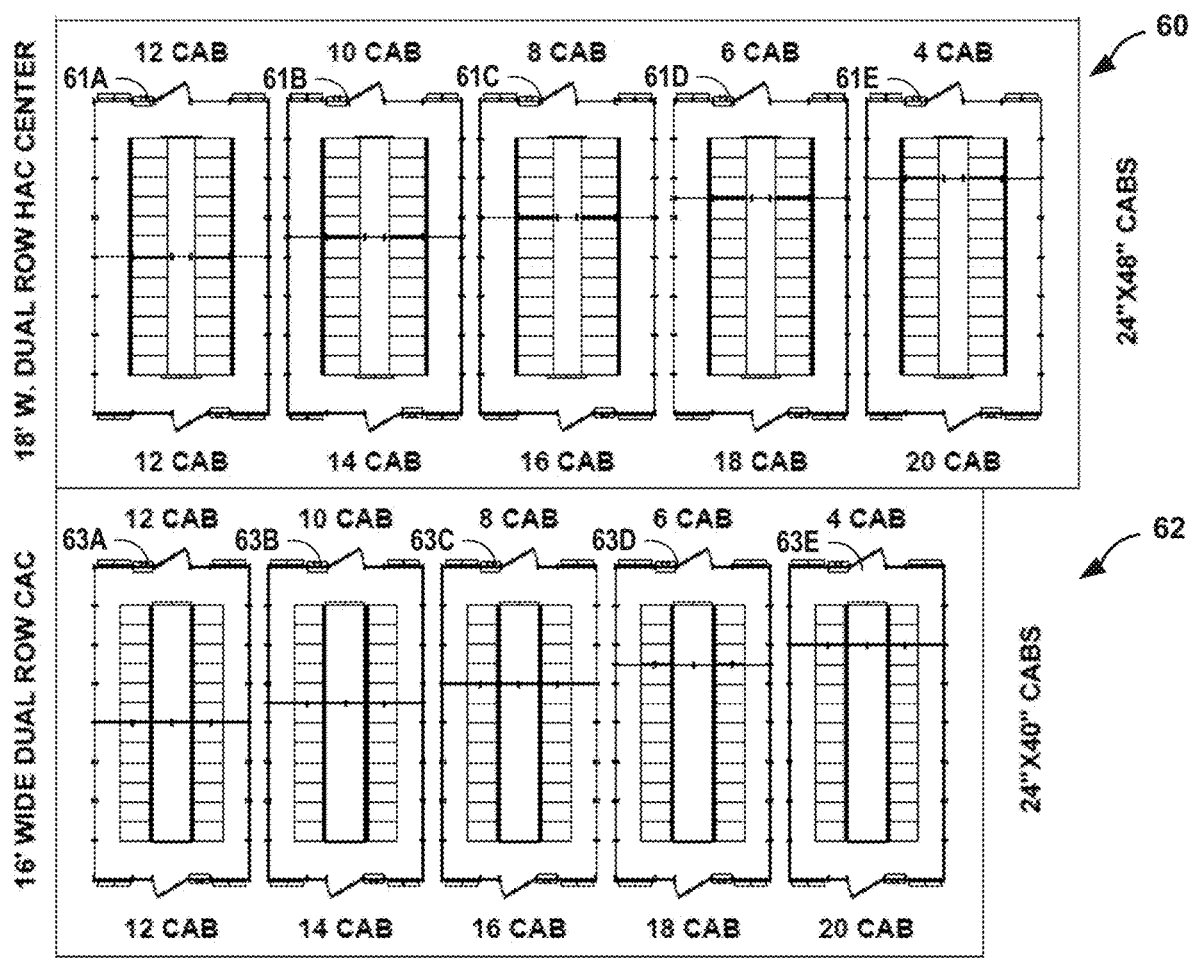

FIGS. 4-6 are block diagrams illustrating example configurations of a module cage enclosure system, in accordance with one or more techniques of the disclosure. FIG. 4 illustrates twelve different example configurations that may be installed in the same data center colocation area footprint using the modular cage enclosure system described herein.

Because servers and/or other devices stored in cabinets of the data center colocation space operate more efficiently and/or reliably within a specific temperature range, it may be desirable to keep air in portions of the data center colocation space within the temperature range. Cabinets storing servers may be arranged in rows within the data center colocation space. Rows may be positioned between "cold aisles" for supplying cool supply air to servers and "hot aisles" for collecting server exhaust and diverting server exhaust to an exhaust plenum. In the view of FIGS. 4-6, cabinets are viewed as oriented such that an exhaust side of the servers is directed out the right-hand side of the cabinets. In the example of FIGS. 4-6, where the right-hand side of the cabinets is contained, the arrangement is referred to as a hot-aisle containment (HAC) arrangement in which a hot aisle collects and diverts exhaust from the servers. Where the left-hand side of the cabinets is contained, the arrangement is referred to as a cold-aisle containment (CAC) arrangement in which temperature of a cold aisle is maintained within a suitable temperature range by the introduction of cooled air, and the rest of the space in the cage is hotter due to exhaust from the servers being released outside the containment area.

Row 40 illustrates ten-foot wide, single row hot-aisle containment (HAC) arrangements having 600 mm by 1000 mm (nominal twenty-four-inch by forty-inch) cabinets. Arrangement 41A illustrates how the modular cage enclosure system may be used to configure two customer cage enclosures securely separated by a dividing partition 46, a first customer cage enclosure enclosing six cabinets and a second customer cage enclosure enclosing seven cabinets. Arrangement 41B illustrates how the modular cage enclosure system may be used to configure two customer cage enclosures, a first customer cage enclosure enclosing five cabinets and a second customer cage enclosure enclosing eight cabinets. Arrangement 41C illustrates how the modular cage enclosure system may be used to configure two customer cage enclosures, a first customer cage enclosure enclosing four cabinets and a second customer cage enclosure enclosing nine cabinets. Arrangement 41D illustrates how the modular cage enclosure system may be used to configure two customer cage enclosures, a first customer cage enclosure enclosing three cabinets and a second customer cage enclosure enclosing ten cabinets. For example, to reconfigure the customer cage enclosures in 41A to those of arrangement 41B, only the panels adjacent to the dividing partition 46 need to be re-arranged, by swapping the 2n panels and the n panels on either side of the dividing partition 46 and moving the existing dividing partition 26 panels to the new post locations corresponding to the new 2n panels, n panels arrangement. The rest of the panels in the customer cage enclosures need not be adjusted.

Row 42 illustrates ten-foot wide, single row cold aisle containment (CAC) arrangements having 600 mm by 1000 mm (nominal twenty-four-inch by forty-inch). Arrangement 43A illustrates how the modular cage enclosure system may be used to configure two customer cage enclosures, a first customer cage enclosure enclosing six cabinets and a second customer cage enclosure enclosing seven cabinets. Arrangement 43B illustrates how the modular cage enclosure system may be used to configure two customer cage enclosures, a first customer cage enclosure enclosing five cabinets and a second customer cage enclosure enclosing eight cabinets. Arrangement 43C illustrates how the modular cage enclosure system may be used to configure two customer cage enclosures, a first customer cage enclosure enclosing four cabinets and a second customer cage enclosure enclosing nine cabinets. Arrangement 43D illustrates how the modular cage enclosure system may be used to configure two customer cage enclosures, a first customer cage enclosure enclosing three cabinets and a second customer cage enclosure enclosing ten cabinets.

Row 44 illustrates ten-foot wide, single row cage arrangements having 600 mm by 1200 mm (nominal twenty-fourinch by forty-eight-inch). Arrangement 45A illustrates how the modular cage enclosure system may be used to configure two customer cage enclosures, a first customer cage enclosure enclosing six cabinets and a second customer cage enclosure enclosing seven cabinets. Arrangement 45B illustrates how the modular cage enclosure system may be used to configure two customer cage enclosures, a first customer cage enclosure enclosing five cabinets and a second customer cage enclosure enclosing eight cabinets. Arrangement 45C illustrates how the modular cage enclosure system may be used to configure two customer cage enclosures, a first customer cage enclosure enclosing four cabinets and a second customer cage enclosure enclosing nine cabinets. Arrangement 45D illustrates how the modular cage enclosure system may be used to configure two customer cage enclosures, a first customer cage enclosure enclosing three cabinets and a second customer cage enclosure enclosing ten cabinets. Arrangements 41A-41D, 43A-43D, and 45A-45D each have a plurality of cage panels and a plurality of posts arranged to form perimeter partitions of the customer cage enclosures. The perimeter partitions can be reconfigured to adjust the dividing partition (e.g., dividing partition 46) by replacing cage panels in the perimeter partition with other cage panels having different nominal widths, or swapping the order of the cage panels in the perimeter partition to move a location of the dividing partition 46 coupled to a post between the swapped cage panels.

FIG. 5 illustrates ten different example configurations that may be installed in the same data center colocation area footprint using the modular cage enclosure system described herein. Row 50 includes eighteen-foot wide, dual row cold-aisle containment (CAC) cages having 600 mm by 1200 mm (nominal twenty-four-inch by forty-eight-inch) and a centered cold aisle location. Arrangement 51A illustrates how the modular cage enclosure system may be used to configure two customer cage enclosures, a first customer cage enclosure enclosing twelve cabinets and a second customer cage enclosure enclosing twelve cabinets. Arrangement 51B illustrates how the modular cage enclosure system may be used to configure two customer cage enclosures, a first customer cage enclosure enclosing ten cabinets and a second customer cage enclosure enclosing fourteen cabinets. Arrangement 51C illustrates how the modular cage enclosure system may be used to configure two customer cage enclosures, a first customer cage enclosure enclosing eight cabinets and a second customer cage enclosure enclosing sixteen cabinets. Arrangement 51D illustrates how the modular cage enclosure system may be used to configure two customer cage enclosures, a first customer cage enclosure enclosing six cabinets and a second customer cage enclosure enclosing eighteen cabinets. Arrangement 51E illustrates how the modular cage enclosure system may be used to configure two customer cage enclosures, a first customer cage enclosure enclosing four cabinets and a second customer cage enclosure enclosing twenty cabinets.

Row 52 includes eighteen-foot wide, dual row hot-aisle containment (HAC) cages having 600 mm by 1200 mm (nominal twenty-four-inch by forty-eight-inch) cabinets and a centered cold aisle location. Arrangements 53A-53E are identical to those of 51A-51E, as far as numbers of cabinets per customer cage enclosure in the various arrangements. Only the quantities and locations of the air containment doors have changed.

Row 60 of FIG. 6 illustrates five different example configurations that may be installed in the same data center colocation area footprint using the modular cage enclosure system described herein. Row 60 includes eighteen-foot wide, dual row hot-aisle containment (HAC) cages having 600 mm by 1200 mm (nominal twenty-four-inch by forty-eight-inch) and a centered hot aisle location. Arrangement 61A illustrates how the modular cage enclosure system may be used to configure two customer cage enclosures, a first customer cage enclosure enclosing twelve cabinets and a second customer cage enclosure enclosing twelve cabinets. Arrangement 61B illustrates how the modular cage enclosure system may be used to configure two customer cage enclosures, a first customer cage enclosure enclosing ten cabinets and a second customer cage enclosure enclosing fourteen cabinets. Arrangement 61C illustrates how the modular cage enclosure system may be used to configure two customer cage enclosures, a first customer cage enclosure enclosing eight cabinets and a second customer cage enclosure enclosing sixteen cabinets. Arrangement 61D illustrates how the modular cage enclosure system may be used to configure two customer cage enclosures, a first customer cage enclosure enclosing six cabinets and a second customer cage enclosure enclosing eighteen cabinets. Arrangement 61E illustrates how the modular cage enclosure system may be used to configure two customer cage enclosures, a first customer cage enclosure enclosing four cabinets and a second customer cage enclosure enclosing twenty cabinets.

Row 62 of FIG. 6 illustrates another five different example configurations that may be installed in the same data center colocation area footprint using the modular cage enclosure system described herein. Row 62 includes sixteen-foot wide, dual row cold-aisle containment (CAC) cages having 600 mm by 1000 mm (nominal twenty-four-inch by forty-inch) and a centered cold aisle location. Arrangements 63A-63E are identical to those of 61A-61E, as far as numbers of cabinets per customer cage enclosure in the various arrangements. The only difference is that location of the hot and cold aisles have been reversed.

Figure 7:
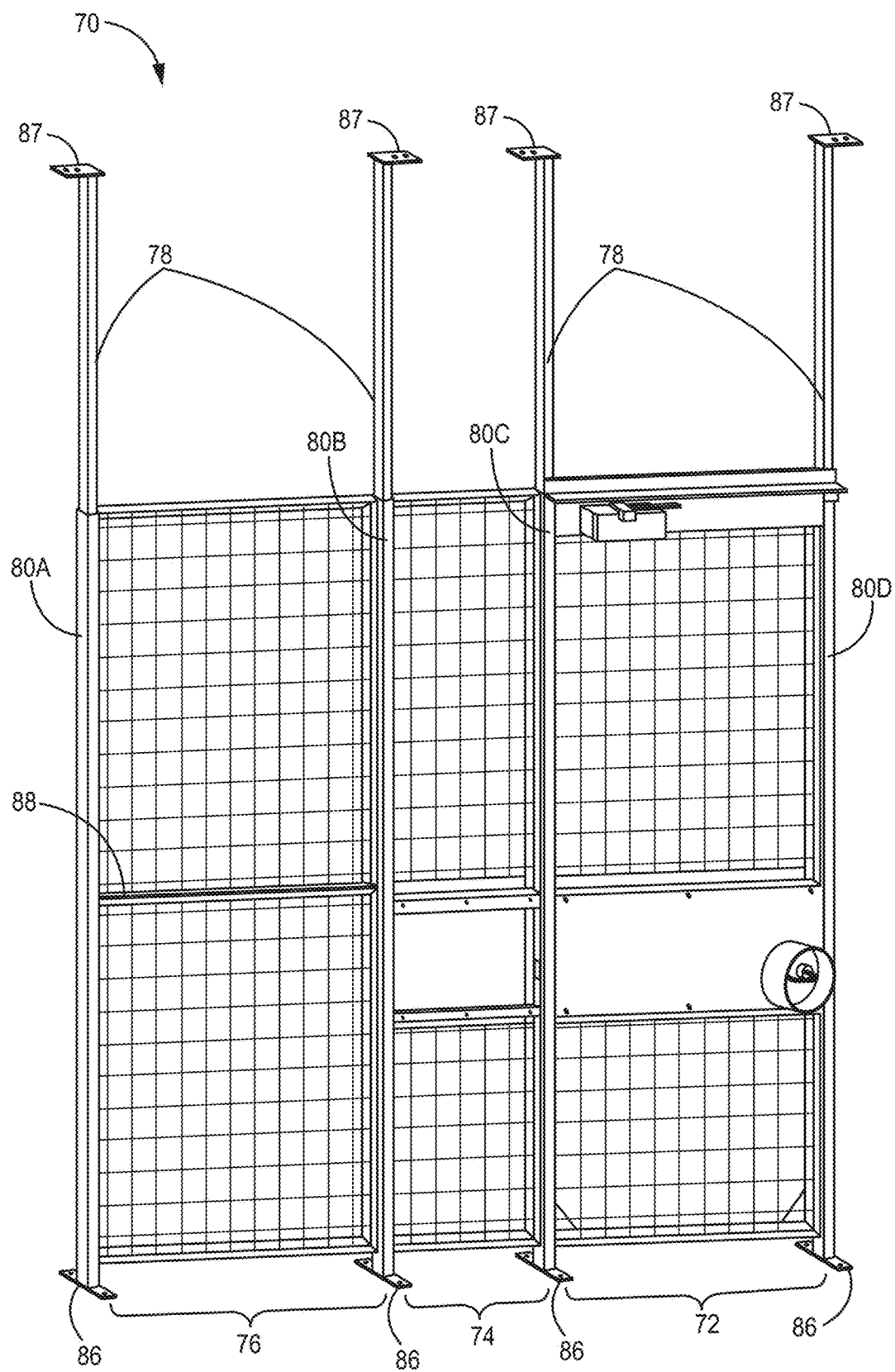
FIG. 7 is a schematic diagram illustrating an axonometric view of an example door and cage panel assembly, in accordance with one or more techniques of the disclosure.

FIG. 7 is a schematic diagram illustrating an axonometric view of an example door and cage panel assembly 70, in accordance with one or more techniques of the disclosure. Door and cage panel assembly 70 includes door 72, biometric reader/demarcation panel assembly 74, panel 76, posts 80A-80D ("posts"), and post extensions 78.

Posts 80 are hollow, to receive post extensions 78. Posts 80 may be, for example, 2-inch square posts. Post 80C may be a gate tube post, configured to receive electrical wiring for components of door 72, such as a biometric panel and electrified hinges, for example. Door 72 may be attached to gate tube post 80C by hinges.

Posts 80 include symmetric base plates 86. Base plates 86 include a pair of symmetrically arranged plate extensions that can be affixed to a floor of the data center colocation space. The plate extensions of base plates 86 may have holes to accommodate anchors for fastening to concrete slabs or screws for affixing the base plates 86 of posts 80 to the raised floor assembly by screwing into one or more floor tiles, pedestals, stringers or other structural supports located below the floor tiles.

In the example of FIG. 7, base plates 86 are symmetric, and the symmetric plate extensions may be oriented perpendicular to a plane of the panel attached to the post 80. The symmetric base plates 86 may provide stability to a cage partition and help avoid overturning in response to a force applied laterally to the cage partition. In some examples, base plates 86 may have dimensions of two inches by seven inches by ¼ inch.

Post extensions 78 may be inserted within the hollow posts 80, and may enable posts 80 to have adjustable height.

Post extensions 78 may be attached to (e.g., screwed into) a ceiling of the data center colocation space. In some examples, posts 80 may be two inches square and 1/8 inch thick. Post extensions 78 have smaller dimensions than posts 80, such as 1¾ inches square. In some examples, in may be recommended that post extensions 78 be inserted at least six inches into posts 80.

Post extensions 78 include asymmetric top mounting plates 87 having a single, asymmetrically arranged plate extension for attaching the post to a ceiling of the data center colocation space. The plate extension of top mounting plates 87 may have holes to accommodate bolts or screws for affixing the post 80 to a ceiling grid or structure of a data center colocation space. Post extensions 78 may be rotated relative to posts 80 before insertion such that the most suitable orientation of asymmetric top mounting plates 87 for the space may be chosen. The asymmetric shape of the top mounting plates 87 can enable the posts 80 to be installed in a corner of a data center colocation space without requiring any modification of the post extension, such as cutting off a portion of the top mounting plates. In contrast, one plate extension of symmetric base plates 86 may need to be cut off for posts 80 to fit into a corner of a data center colocation space. In some examples, asymmetric top mounting plates may have dimensions of two inches by six inches by ¼ inch.

In some examples, after the post extension 78 is inserted and the desired height of the post extension 78 is reached, post extensions 78 may be fastened to posts 80. In other examples, post extensions 78 may not be fastened to posts 80, but may be fastened only to the ceiling. The use of post extensions 78 allow posts to be easily installed in spaces having various heights. Post extensions 78 also accommodate situations where the height of the ceiling or roof structure varies within the data center colocation space. Moreover, post extensions 78 can allow for flexibility in height in the event of settling or deflection of the ceiling structure or roof structure to which the post extensions are coupled. Post extensions may be, for example, 1¾ inch by 1¾ inch by 14 gauge square tubes, welded to 2 inch by 6 inch by ¼ inch top plate.

In some examples, there may not be a post extension 78 attached to each post 80. In this case, a top support or top capping bars (not shown) may be attached between the tops of posts 80 to provide additional lateral support for the cage panel assembly 70. In some examples, the top capping bars may be 2 inch by 1/8 inch by 9 foot, ten inch long hot-rolled steel flat bar with holes 5 inches from each end and then 12 inches o.c. in between; 2¼ inch by 1 inch and 3½ inch by 1 inch cold-rolled steel channels. Capping channel, if required, may be installed with legs up to allow for installation of demarcation box aligned with top of cage panels.

In some examples, the cage panel assemblies may include horizontal panel stiffeners (not shown). Horizontal panel stiffeners may include, for example, two of ½ inch by 1 inch by 1/8 inch cold-rolled steel channels, bolted or riveted toe to toe with wire woven through; or ¼ inch by ¾ inch thick hot rolled flat stock, located where indicated on the drawings and welded to wire mesh and vertical frames. In some examples, cage panels may be attached to a wall of data center colocation space 10 by wall cops, such as near the top and bottom of the cage panels.

Figure 8:
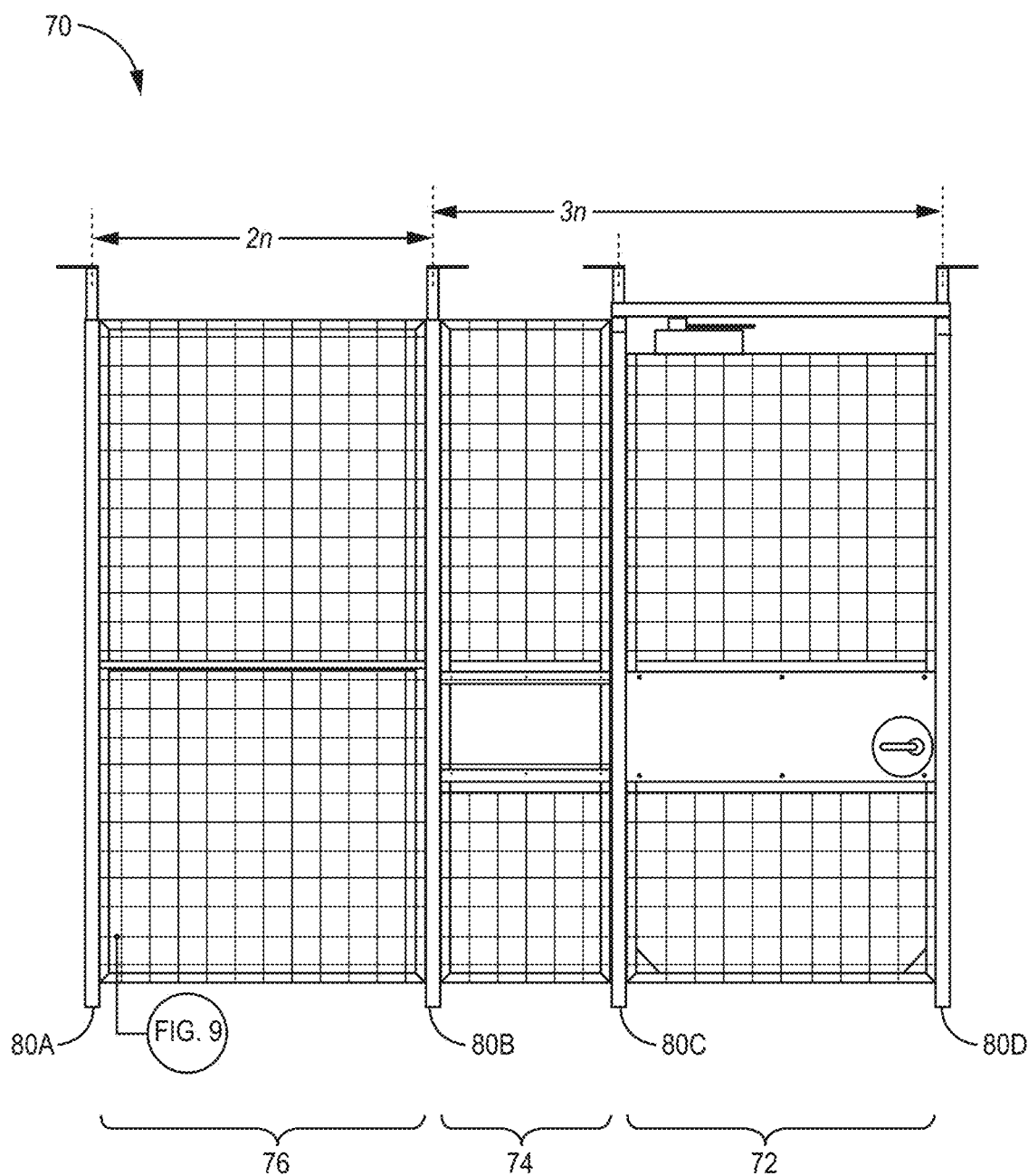
FIG. 8 is a schematic diagram illustrating an elevation of the example door and cage panel assembly of FIG. 7, in accordance with one or more techniques of the disclosure.

FIG. 8 is a schematic diagram illustrating an elevation of the example door and cage panel assembly 70 of FIG. 7, in accordance with one or more techniques of the disclosure. Panel 76 has a nominal width that is a modular increment, meaning that any of the nominal widths divided by the modulus has a remainder of zero. In some examples, the value of the modulus may be selected based on dimensions of infrastructure in the data center colocation space, such as a length or width of server cabinets in the colocation space, or dimensions of tiles in a floor of the data center colocation space. Panel 76 has a nominal width of 2n.

As one example, where the nominal widths of the cage enclosure panels are selected based on 24-inch by 24-inch floor tiles, the modulus may be chosen as twenty-four inches. In this example, where posts are two inches square, panel 76 may have a nominal width of forty-eight inches and an actual width of forty-six inches. The door assembly that includes panel 72, post 80C, and panel 74 may have a nominal total width of seventy-two inches, and an actual total width of seventy inches. In some examples, panel 74 alone may have an actual width 24⅛ inches wide, and door panel 72 may have an actual width of 43⅞ inches.

As another example, where the nominal widths of the cage enclosure panels are selected based on 600 mm by 600 mm floor tiles, the modulus may be chosen as 600 mm. In this example, where posts are 50 mm square, panel 76 may have a nominal width of 1200 mm and an actual width of 1150 mm. The door assembly that includes panel 72, post 80C, and panel 74 may have a nominal width of 1800 mm, and an actual width of 1750 mm.

Panels 74, 76 may be 7 feet, 9 inches high, in some examples. In some examples, the panels may be mounted to posts such that the panels are elevated 3 inches above the floor, such that the top of the panels is 8 feet above the floor. When installed, a top of door may be aligned with the top of adjacent panels. For doors that do not extend full height of partition, a transom may be provided over the door, fabricated from same mesh and framing as partition panels. Hinges may be, for example, 4½ inch by 4½ inch, 2 pairs per door; welded or screwed to door and jamb; removable at electrified locations.

In some examples, a removable portion of panel 74 may be removed and a demarcation point cabinet may be installed in its place, as described in U.S. Pat. No. 8,650,805, entitled "SYSTEMS AND METHODS FOR DMARC IN A CAGE MESH DESIGN," issued Feb. 18, 2014, the entire contents of which are incorporated by reference herein. The demarcation point cabinet provides network connectivity between network equipment in the cage and one or more networks, including for connecting to one or more exchanges, such as an Internet Exchange, Ethernet Exchange, or Cloud Exchange, for example. One or more cross-connects may be installed from the network(s) through the demarcation point cabinet to network wiring of the customers, such as to one or more customer cabinets within the cage. In examples where the demarcation point cabinet is slightly smaller than the removable portion of panel 74, an additional infill panel piece is also installed to fill the remaining open gap.

Figure 9:
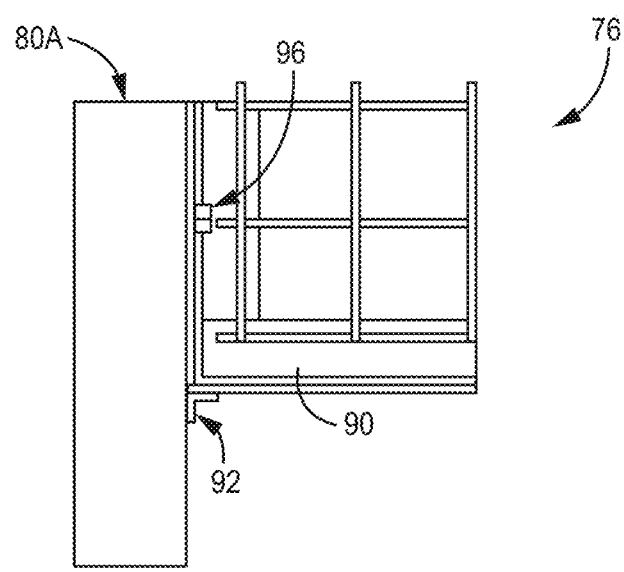
FIG. 9 is a schematic diagram illustrating in further detail how a cage panel is connected to a post in the assembly of FIGS. 7 and 8, in accordance with one or more techniques of the disclosure.

FIG. 9 is a schematic diagram illustrating in further detail how a cage panel 76 is connected to a post 80A in the assembly of FIGS. 7 and 8, in accordance with one or more techniques of the disclosure. Post 80A is a two-inch by two-inch panel tube post. Panel 76 includes a woven wire 94 attached to a frame 90. In some examples, wire 94 may be tack welded to an angle frame. In some examples, wire 94 may be clinched to framing. The wire 94 may be 10 gauge wire (0.135-inch diameter) (e.g., steel wire), spaced 1-inch by 1-inch. The angle frame may be 1¼ inch by 1¼ inch, for example.

In some examples, the woven wire 94 has an intermediate crimp, in which wires pass over one and under the next adjacent wire in both directions, with wires crimped before weaving and with extra crimps between the intersections. In some examples, the woven wire 94 has a lock crimp, with deep crimps at points of the intersection that lock wires securely in place.

The frame 90 of panel 76 may be fastened to post 80 by fastening means 96, such as screws, bolts, nails, staples, welding, or the like. In some examples, panel 76 may be fastened to post 80 by ¼ inch by ¼ inch screws. An angle aligner tab 92 may be attached to panel 76 and post 80A to facilitate proper alignment of the panel 76 relative to post 80A.

Figure 10:
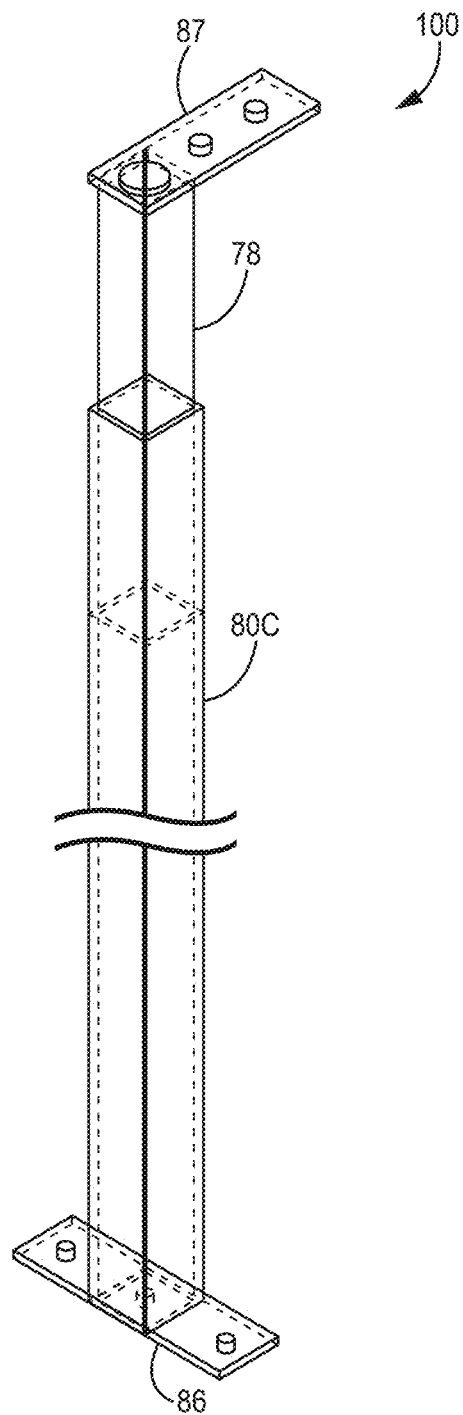
FIG. 10 is a schematic diagram illustrating an example isometric view of a post assembly, in accordance with one or more techniques of the disclosure.

FIG. 10 is a schematic diagram illustrating an example isometric view of an example post assembly 100, in accordance with one or more techniques of the disclosure. The post assembly 100 may a gate tube post such as gate tube post 80C of FIGS. 7 and 8, and may be on the hinge side of a door such as door 72. Post assembly 100 includes a hollow post 80C having a symmetric base plate 86 with screw holes, and an asymmetric top mounting plate 87 with screw holes. The top mounting plate 87 may also include a hole, such as 1¼ inches in diameter, for passage of line voltage for electrified hinges. The post assembly includes an extension tube post 78 that inserts into the tube post with an unrestricted slip fit. The extension tube post may insert up to six inches into the tube post, in some examples. In some examples, the extension tube post is 14-gauge metal, and the tube post is 12-gauge metal. The tube post may include holes to receive electrified hinges, and holes for electrified hinge wire harness clearance (not shown in FIG. 10). The tube post may also include a notch opposite the holes for a wire chase to the biometric panel (not shown in FIG. 10). The tube posts may be cold-formed structural-steel tubing, in some examples.

Example design details for the cage mesh partitions are described below. These examples may be applied to any of the foregoing examples. In some examples, various elements of the cage panels and posts may be made of steel. Some elements may be metallic-coated steel sheets, such as commercial steel with G60 zinc (galvanized) or A60 zinc-iron-alloy (galvannealed) coating designation. In some examples, elements may have seismic bracing, i.e., angles with legs not less than 1¼ inch wide, formed from 0.04-inch-thick, metallic-coated steel sheet; with bolted connections and ¼-inch-diameter bolts, as required. In some examples, panel-to-post fasteners may include one or more of steel bolts, nuts, screws and washers.

In some examples, such as where the modular cage enclosure system is installed on a concrete slab floor (rather than a raised floor) posts may be installed using expansion anchors in concrete having capability to sustain, without failure, load imposed within factors of safety indicated. The anchors may include drop-in anchors, and may be zinc-plated carbon steel, for example. In some examples, posts may be installed using powder-actuated fasteners in concrete, which may include a fastener system of type suitable for application indicated and fabricated from corrosion-resistant materials; with clips or other accessory devices for attaching hangers of type indicated, and with capability to sustain, without failure, a load equal to 10 times that imposed by wire mesh construction. However, in some cases powder-actuated fasteners would not be used to attach cage mesh system components to floor surfaces other than concrete slabs. Post base plate fasteners at raised floor tiles may include steel bolts, nuts, screws, plates and washers as required for base plate attachment to top and bottom of floor tiles and/or stringers.

Figure 11:
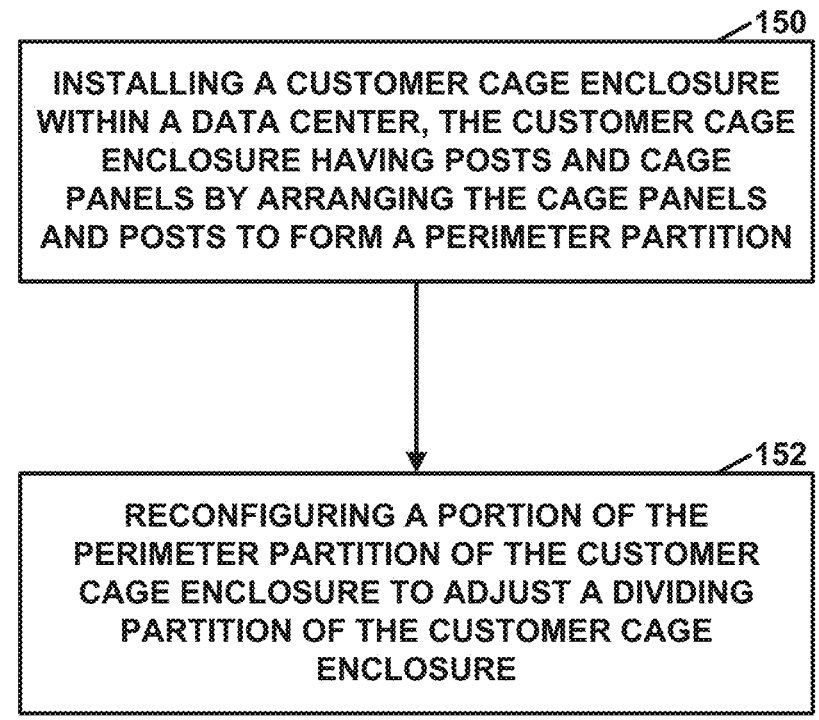
FIG. 11 is a flowchart illustrating example installation and reconfiguration of an example modular cage enclosure system, in accordance with the techniques of this disclosure.

FIG. 11 is a flowchart illustrating example installation and reconfiguration of an example modular cage enclosure system, in accordance with the techniques of this disclosure. A method includes installing, within a data center, a customer cage enclosure having first dimensions, the customer cage enclosure comprising a plurality of posts, and a plurality of cage panels (150), wherein each of the cage panels is removably coupled to one or more of the plurality of posts, wherein a nominal width of each of the cage panels is congruent based on a modulus, wherein an actual width of each of the cage panels is equal to a difference between the nominal width of the cage panel and the width of one of the plurality of posts, and wherein any combination of a subset of the plurality of cage panels coupled in a common orientation to a subset of the plurality of posts has a combined width, between respective centers of end posts of the subset of the plurality of posts, that is congruent based on the modulus, wherein installing comprises arranging one or more of the plurality of cage panels and two or more of the plurality of posts to form a perimeter partition of the customer cage enclosure. The method also includes reconfiguring a portion of the perimeter partition of the customer cage enclosure to adjust a dividing partition of the customer cage enclosure perpendicular to at least a portion of the perimeter partition, by replacing at least a first cage panel of the plurality of cage panels in the perimeter partition with at least a second cage panel of the plurality of cage panels, the first cage panel having a first nominal width and the second cage panel having a second nominal width different than the first nominal width (152).

In some examples, reconfiguring the perimeter partition of the customer cage enclosure to adjust the dividing partition includes replacing the first cage panel, a third cage panel of the plurality of cage panels having the first nominal width, and a post coupled to the first cage panel and the third cage panel, with the second cage panel, and removing the dividing partition, wherein the dividing partition comprises at least a fourth cage panel coupled to the post coupled to the first cage panel and the third cage panel.

In some examples, reconfiguring the perimeter partition of the customer cage enclosure to adjust the dividing partition comprises converting the customer cage enclosure to two smaller customer cage enclosures, wherein converting includes replacing the second cage panel with: the first cage panel, a third cage panel of the plurality of cage panels having the first nominal width, and a post coupled to the first cage panel and the third cage panel, and adding the dividing partition, wherein the dividing partition comprises at least a fourth cage panel coupled to the post coupled to the first cage panel and the third cage panel.

In some examples, reconfiguring the perimeter partition of the customer cage enclosure to adjust the dividing partition comprises moving the dividing partition, wherein moving the dividing partition includes replacing the second cage panel with: the first cage panel, a third cage panel of the plurality of cage panels having the first nominal width, and a post coupled to the first cage panel and the third cage panel, wherein the dividing partition comprises at least a fourth cage panel coupled to the post coupled to the first cage panel and the third cage panel.

In some examples, the method also includes affixing the posts to floor tiles of a data center colocation space such that a center of each of the posts is aligned with adjacent edges of the floor tiles. In some examples, installing also includes affixing the cage panels to the posts.

In some examples, installation may include one or more of the following example aspects. The posts are anchored to the floor. The panels are attached to the posts, such as using steel bolts, nuts, screws and washers. In some examples the panels are attached to the posts before the posts are anchored to the floor, while in other examples, the posts are anchored to the floor first, and the panels are then attached to the posts. Anchoring the posts to the floor where the floor is a concrete slab may include anchoring with ⅜-inch diameter, post-installed expansion anchors through the holes in base plates 86 of each post, and adjusting wire mesh partition posts in floor shoes to achieve level and plumb installation. Anchoring the posts to the floor where the floor is a concrete slab may include anchoring with ⅜-inch diameter bolts with washers through base plates 86 and the access floor.

In some examples, an installer may anchor wire mesh partitions to walls at 12 inches o.c. through back corner panel framing and as follows: For concrete and solid masonry anchorage, use drilled-in expansion shields and hanger or lag bolts. For hollow masonry anchorage, use toggle bolts. For steel-framed gypsum board assemblies, use hanger or lag bolts set into wood backing between studs. Coordinate with stud installation to locate backing members. Install temporary shims at gaps between panels and vertical supports to provide uniform spacing. Secure top capping bar (where occurs) to top framing channels with ¼-inch-diameter "U" bolts spaced not more than 28 inches o.c. Provide line posts at locations indicated or, if not indicated, as follows: For partitions that are 7 to 9 feet high, spaced at 15 to 20 feet o.c. For partitions that are 10 to 12 feet high, located between every other panel. For partitions that are more than 12 feet high, located between each panel. Install post extensions connected to unistrut ceiling grid at locations indicated, or if not indicated, at 10 feet o.c. maximum. Provide a minimum 6" overlap inside primary post. Post extensions may not be fastened to the primary post sleeve order to allow for vertical deflection of overhead building structural supports. May provide seismic supports and bracing as required for code compliance and stability, extending and fastening members to supporting structure. Install doors and hinges. Weld or bolt sheet metal bases to wire mesh partitions and doors where indicated. Bolt accessories to wire mesh partition framing.

Although the foregoing examples have been illustrated as being used to allow configuration and reconfiguration of customer cages in a data center colocation space, the assembly may be used in a variety of different applications requiring modular enclosure systems.

Various examples have been described. These and other examples are within the scope of the following claims.

What is claimed is:

1. A system comprising:
   a data center colocation space comprising a floor, the floor comprising a plurality of floor tiles;
   a plurality of posts arranged with a center of each post of the plurality of posts aligned with an adjoining edge of at least two of the plurality of floor tiles, and each post of the plurality of posts perpendicular to the floor; and
   a plurality of cage panels, wherein the plurality of cage panels and the plurality of posts are arranged to form at least one cage enclosure within the data center colocation space, wherein each of the plurality of cage panels is removably coupled to one or more of the plurality of posts, wherein a nominal width of each of the plurality of cage panels is congruent based on a modulus equal to a width of each of the plurality of floor tiles, wherein each of the plurality of cage panels has an actual width less than its nominal width.

2. The system of claim 1, wherein the actual width of each of the plurality of cage panels is equal to a difference between the nominal width of the cage panel and a width of one of the plurality of posts.

3. The system of claim 1, wherein any combination of a subset of the plurality of cage panels coupled in a common orientation to a subset of the plurality of posts has a combined width, between respective centers of end posts of the subset of the plurality of posts, that is congruent based on the modulus.

4. The system of claim 1, wherein the width of each of the plurality of floor tiles is 24 inches, wherein a length of each of the plurality of floor tiles is 24 inches, wherein the nominal width of a first subset of the plurality of cage panels is 24 inches and wherein the nominal width of a second subset of the plurality of cage panels is 48 inches, wherein a width of each of the plurality of posts is 2 inches.

5. The system of claim 1, wherein the width of each of the plurality of floor tiles is 600 mm, wherein a length of each of the plurality of floor tiles is 600 mm, wherein the nominal width of a first subset of the plurality of cage panels is 600 mm and wherein the nominal width of a second subset of the plurality of cage panels is 1200 mm, wherein a width of each of the plurality of posts is 50 mm.

6. The system of claim 1, wherein each of the posts comprises:
   a base plate comprising a pair of symmetrically arranged plate extensions for attaching the post to the floor; and
   a top mounting plate comprising a single asymmetrically arranged plate extension for attaching the post to a ceiling of the data center colocation space.

7. The system of claim 1, wherein one or more of the plurality of posts includes a top mounting plate for affixing to a ceiling structure of the data center colocation space.

8. The system of claim 1, wherein the plurality of cage panels and the plurality of posts are arranged to form at least two cage enclosures within the data center colocation space, wherein a first one of the at least two cage enclosures securely contains network equipment for a first customer, and wherein a second one of the at least two cage enclosures securely contains network equipment for a second customer.

9. The system of claim 1, further comprising: a door assembly having a nominal width congruent based on the modulus, wherein the at least one cage enclosure includes the door assembly.

10. A system comprising:
    a plurality of posts, each of the plurality of posts having a base plate for attaching the corresponding post of the plurality of posts to a floor of a data center colocation space; and
    a plurality of cage panels, wherein each of the plurality of cage panels is removably coupled to one or more of the plurality of posts, wherein a nominal width of each of the plurality of cage panels is congruent based on a modulus, wherein an actual width of each of the plurality of cage panels is equal to a difference between the nominal width of the cage panel and a width of one of the plurality of posts, and wherein any combination of a subset of the plurality of cage panels coupled in a common orientation to a subset of the plurality of posts has a combined width, between respective centers of end posts of the subset of the plurality of posts, that is congruent based on the modulus.

11. The system of claim 10, wherein the base plate includes a pair of symmetrically arranged plate extensions for attaching the corresponding post of the plurality of posts to the floor; and wherein each of the plurality of posts comprises a top mounting plate comprising a single asymmetrically arranged plate extension for attaching the corresponding post of the plurality of posts to a ceiling of the data center colocation space.

12. The system of claim 10, wherein the plurality of cage panels and the plurality of posts are arranged to form at least two cage enclosures within the data center colocation space, wherein a first one of the at least two cage enclosures securely contains network equipment for a first customer, and wherein a second one of the at least two cage enclosures securely contains network equipment for a second customer.

13. A system comprising:
a data center colocation space comprising a floor;
a plurality of posts arranged with each post of the plurality of posts perpendicular to the floor; and
a plurality of cage panels, wherein the plurality of cage panels and the plurality of posts are arranged to form at least one cage enclosure within the data center colocation space, the at least one cage enclosure enclosing a plurality of cabinets,
wherein each of the plurality of the posts is arranged with a center of each post of the plurality of posts aligned with an edge of at least two of the plurality of cabinets, wherein each of the plurality of cage panels is removably coupled to one or more of the plurality of posts, wherein a nominal width of each of the plurality of cage panels is congruent based on a modulus equal to a width of each of the plurality of cabinets, wherein each of the plurality of cage panels has an actual width less than its nominal width.

14. The system of claim 13, wherein an actual width of each of the plurality of cage panels is equal to a difference between the nominal width of the cage panel and a width of one of the plurality of posts.

15. The system of claim 13, wherein any combination of a subset of the plurality of cage panels coupled in a common orientation to a subset of the plurality of posts has a combined width, between respective centers of end posts of the subset of the plurality of posts, that is congruent based on the modulus.

16. The system of claim 10, further comprising: a door assembly having a nominal width congruent based on the modulus.

17. The system of claim 13, further comprising: a door assembly having a nominal width congruent based on the modulus, wherein the at least one cage enclosure includes the door assembly.

18. The system of claim 10, wherein one or more of the plurality of posts includes a top mounting plate for affixing to a ceiling structure of the data center colocation space.

19. The system of claim 13, wherein one or more of the plurality of posts includes a top mounting plate for affixing to a ceiling structure of the data center colocation space.

* * * * *